United States Patent [19]

Zojer

[11] Patent Number: 4,857,932
[45] Date of Patent: Aug. 15, 1989

[54] FAST ANALOG/DIGITAL CONVERTER HAVING EQUAL PROPAGATION TIMES FOR THE CLOCK AND THE ANALOG SIGNAL

[75] Inventor: Bernhard Zojer, Villach, Austria

[73] Assignee: Siemens Aktiengesellschaft, Berlin and Munich, Fed. Rep. of Germany

[21] Appl. No.: 24,896

[22] Filed: Mar. 12, 1987

Related U.S. Application Data

[63] Continuation of Ser. No. 828,301, Feb. 11, 1986, abandoned.

[30] Foreign Application Priority Data

Feb. 12, 1985 [DE] Fed. Rep. of Germany ....... 3504746

[51] Int. Cl.$^4$ .............................................. H03M 1/36
[52] U.S. Cl. .................................... 341/159; 341/155; 341/158
[58] Field of Search ..... 340/347 AD, 347 C, 341 CC, 340/347 M; 368/120; 333/138; 328/56; 341/155, 158, 159

[56] References Cited

U.S. PATENT DOCUMENTS

| | | | |
|---|---|---|---|
| 3,597,761 | 8/1971 | Fraschilla et al. | 340/347 AD |
| 3,611,350 | 10/1971 | Leibowitz et al. | 340/347 AD |
| 3,829,853 | 8/1974 | Freedman | 340/347 AD |
| 4,083,043 | 4/1978 | Breuer | 340/347 AD |
| 4,633,896 | 12/1986 | Zoher et al. | 340/347 AD |

FOREIGN PATENT DOCUMENTS 2946934 5/1981 Fed. Rep. of Germany .

OTHER PUBLICATIONS

Hoeschele, Analog-to-Digital/Digital-to-Analog Conversion Techniques, John Wiley & Sons, Inc., 1970, pp. 408–411.
Schmid, Electronic Analog/Digital Conversions, Van Nostrand Reinhold Co., 1970, pp. 296–299.
Millman et al., Pulse and Digital Circuits, McGraw-Hill Book Co., Inc., 1956, pp. 40–47.
J. Neal et al., "Track-and-Holds False Flash Converters to Their Limits", Electronic Design, vol. 32, No 9, pp. 381–388.
M. Lonsborough, "A 6-Bit Monolithic Video Flash Converter", Microelectronics and Reliability, vol. 21, No. 6, pp. 837–849.

*Primary Examiner*—William M. Shoop, Jr.
*Assistant Examiner*—Brian Young
*Attorney, Agent, or Firm*—Herbert L. Lerner; Laurence A. Greenberg

[57] ABSTRACT

An analog-digital converter operating according to the parallel method includes clock-controlled comparators having reference voltages, the reference voltage of a given one of the comparators being closet to a given analog voltage at a sampling instant, a device for feeding in a clock signal, a device for feeding in an analog signal, and a device connected between the comparators and the clock signal and analog signal feeding devices for setting equal propagation times of the clock signal and the analog signal fed to at least the given one of the comparators.

7 Claims, 1 Drawing Sheet

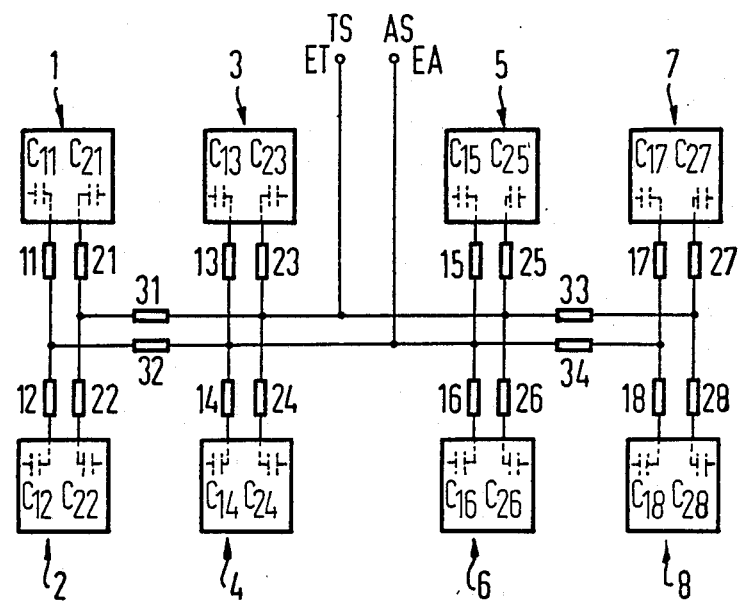

FAST ANALOG/DIGITAL CONVERTER HAVING EQUAL PROPAGATION TIMES FOR THE CLOCK AND THE ANALOG SIGNAL

This application is a continuation, of application Ser. No. 828,301, filed Feb. 11, 1986, now abandoned.

The invention relates to an analog/digital converter according to the parallel method, including clock-controlled comparators and fed-in clock and analog signals.

The parallel method is commonly used for fast analog/digital converters which convert an analog voltage into a proportional binary number. In this process, the analog input voltage is simultaneously compared with equidistant reference voltages and the closest one is determined. The reference voltages are generated by means of a voltage divider and one comparator is needed for every possible binary number; for instance, a 6-bit analog/digital converter requires 64 comparators.

As a rule, linearity errors occur in analog/digital converters working in accordance with the parallel method. In such a case, the static linearity is limited by the input currents of the comparators which are also connected to the reference voltage divider. This problem is the subject of U.S. Pat. No. 4,633,219, filed Feb. 14, 1985, which describes a possible construction of the resistors of the reference voltage divider in such a manner that the reference voltage is only applied exactly to that comparator which is closest to the analog voltage at the moment of sampling, or which reacts to the analog signal. All other reference voltages can deviate from the ideal value but this has no influence on the digital output signal.

The dynamic linearity of fast analog/digital converters is influenced by the phase relationships between the clock and analog signals. Generally, greater phase differences can be improved by short wiring runs.

It is accordingly an object of the invention to provide a fast analog/digital converter which overcomes the hereinafore-mentioned disadvantages of the heretofore-known devices of this general type, and to improve the dynamic linearity of the analog/digital converter.

With the foregoing and other objects in view there is provided, in accordance with the invention, an analog/digital converter operating according to the parallel method, comprising clock-controlled comparators having reference voltages, the reference voltage of a given one of the comparators being closest to a given analog voltage at a sampling instant, means for feeding in a clock signal, means for feeding in an analog signal, and means connected between the comparator and the clock signal and analog signal feeding means for setting equal propagation times of the clock signal and the analog signal fed to at least the given one of the comparators.

In accordance with another feature of the invention, the clock-controlled comparators including the given one of the comparators are in the form of or are combined in blocks.

In accordance with a further feature of the invention, the clock signal feeding means are in the form of a central clock signal feed for all of the clock-controlled comparators or comparator blocks and the analog signal feeding means are in the form of a central analog signal feed for all of the clock-controlled comparators or comparator blocks.

In accordance with a concomitant feature of the invention, the setting means are in the form of line resistances of clock signal and analog signal lines adapted to the clock-controlled comparators or comparator blocks.

Other features which are considered as characteristic for the invention are set forth in the appended claims.

Although the invention is illustrated and described herein as embodied in a fast analog/digital converter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying single figure of the drawing which is schematic and block circuit diagram of an analog/digital converter according to the invention.

Clock and analog signals travel along RC lines and the signal propagation times are substantially determined by line resistances R of the lines and comparator input capacities C. However, the input impedances of the comparators on the analog side and therefore the propagation time differences between the analog signal and the clock signal depend on the analog voltage. Shortening the line lengths alone shortens the absolute propagation times, but does not eliminate the propagation time differences.

In accordance with the object of the invention, it is sufficient to only assure equal propagation times between the clock signal and the analog signal to the comparator having a reference voltage which is closest to the analog voltage at the sampling instant or which reacts to the analog signal.

According to the invention, the voltage dependence of the input impedance of each comparator can therefore be replaced by a location dependence, i.e., a relevant capacity and therefore a relevant propagation time difference is assigned to each comparator. The line configurations are subsequently optimized in the direction toward the same propagation time difference applicable to every comparator. The conductor width and thickness as well as the disposition of parallel-connected conductor runs in different planes of an integrated circuit, for instance, can serve as parameters therefor.

It is advantageous to feed the clock and analog signals centrally with respect to the comparators. For technological reasons, a circular disposition of the comparators about a central feed point is often not possible. According to the invention, it is specifically advantageous to combine the comparators in blocks. It is possible to determine a relevant capacity for the start and the end of every block or for each block by itself. According to a further development of the invention, the line resistance at the beginning and the end of each block or for each block are chosen in such a way that the same propagation time differences are obtained each time.

Referring now to the single FIGURE of the drawing in detail, there are seen blocks 1 to 8 which symbolize eight comparators of a 3-bit analog/digital converter or eight comparator blocks each having 32 comparators, of an 8-bit analog/digital converter, for example. The blocks 1 to 8 are controlled by a clock signal TS; an analog signal AS is simultaneously supplied to the blocks. Relevant capacities $C_{11}$ to $C_{18}$ are assigned to each block 1 to 8 for the analog signal, and relevant capacities $C_{21}$ to $C_{28}$ are assigned to the blocks for the clock signal.

Resistors 11 to 18, 32 and 34 connected from a feed point EA of the analog signal AS to the respective blocks 1 to 8 and resistors 21 to 28, 31 and 33 connected from a feed point ET of the clock signals TS to the respective blocks 1 to 8, which symbolize the line resistances, are chosen for the respective blocks 1 to 8 in such a manner that the relevant propagation time differences for the blocks 1 to 8 are always the same.

I claim:

1. Analog/digital converter operating according to the parallel method, comprising clock-controlled comparators having respective reference voltages, said reference voltages of a given one of said comparators being closest to a given analog voltage at a sampling instant, means for feeding in a clock signal, means for feeding in an analog signal, and means connected between said comparators and said clock signal and analog signal feeding means for setting equal propagation times of the clock signal and the analog signal fed to at least said given one of said comparators.

2. Analog/digital converter according to claim 1, wherein said clock signal feeding means are in the form of a central clock signal feed for all of said clock-controlled comparators and said analog signal feeding means are in the form of a central analog signal feed for all of said clock-controlled comparators.

3. Analog/digital converter according to claim 1, wherein said setting means are in the form of line resistances of clock signal and analog signal lines adapted to said clock-controlled comparators.

4. Analog/digital converter according to claim 1, wherein said comparators are formed into clock-controlled comparator groups having equal propagation times of the clock signal and the analog signal to at least the group that includes said given one of said comparators having a reference voltage being closest to a given analog voltage at the sampling instant.

5. Analog/digital converter according to claim 4, wherein said clock signal feeding means are in the form of a central clock signal feed for all of said clock-controlled comparator groups and said analog signal feeding means are in the form of a central analog signal feed for all of said clock-controlled comparator groups.

6. Analog/digital converter according to claim 4, wherein said setting means are in the form of line resistances of clock signal and analog signal lines adapted to said clock-controlled comparator groups.

7. Analog/digital converter operating according to the parallel method, including a voltage divider for supplying a plurality of switched equidistant reference voltages, comprising: means for supplying a sampling clock; means for supplying an analog voltage; a plurality of clock-controlled comparators each having respective clock and analog inputs, said inputs having respective input capacitances; conducting means having conductor resistances, for connecting respectively said clock supply means and said clock inputs, and said analog voltage supply means and said analog inputs; wherein each comparator is assigned a respective reference voltage, wherein at each sampling moment, that one comparator only which has a reference voltage closest to the analog voltage at the sampling moment has an exact reference voltage, and wherein said one comparator has input capacitances and conductor resistances to said respective clock and analog supply means matched such that said conductors have propagation delays of equal magnitude.

* * * * *